United States Patent
Yan

(10) Patent No.: US 12,406,734 B2
(45) Date of Patent: Sep. 2, 2025

(54) ONE TIME PROGRAMMABLE MEMORY CELL

(71) Applicant: Shanghai Huali Microelectronics Corporation, Shanghai (CN)

(72) Inventor: Ying Yan, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 159 days.

(21) Appl. No.: 18/368,691

(22) Filed: Sep. 15, 2023

(65) Prior Publication Data

US 2025/0069666 A1   Feb. 27, 2025

(30) Foreign Application Priority Data

Aug. 25, 2023   (CN) .......................... 202311085047.8

(51) Int. Cl.
| | | |
|---|---|---|
| *G11C 16/04* | (2006.01) | |
| *G11C 16/10* | (2006.01) | |
| *G11C 16/26* | (2006.01) | |

(52) U.S. Cl.
CPC ........ G11C 16/102 (2013.01); G11C 16/0433 (2013.01); G11C 16/26 (2013.01); *G11C 2216/26* (2013.01)

(58) Field of Classification Search
CPC ... G11C 16/102; G11C 16/0433; G11C 16/26; G11C 2216/26
See application file for complete search history.

(56) References Cited

U.S. PATENT DOCUMENTS

| | | | |
|---|---|---|---|
| 9,589,971 B1* | 3/2017 | Chang | G11C 17/16 |
| 9,613,714 B1* | 4/2017 | Wong | G11C 17/16 |
| 2019/0341393 A1* | 11/2019 | Peng | H10B 20/25 |
| 2021/0249423 A1* | 8/2021 | Chang | H10B 20/25 |
| 2021/0272642 A1* | 9/2021 | Noguchi | G11C 11/4085 |
| 2021/0312998 A1* | 10/2021 | Yan | G11C 17/16 |
| 2021/0367034 A1* | 11/2021 | Chang | H10D 62/118 |

* cited by examiner

*Primary Examiner* — Ly D Pham
(74) *Attorney, Agent, or Firm* — Banner & Witcoff, Ltd.

(57) ABSTRACT

This application discloses a one-time programmable memory cell, which includes one anti-fuse programmable transistor, one fuse, and two control transistors. One of a source end and a drain end of a first control transistor is connected to one of a source end and a drain end of the anti-fuse programmable transistor, and the other is connected to one of a source end and a drain end of a second control transistor and one end of the fuse. The other of the source end and the drain end of the second control transistor is connected to the ground. The one time programmable memory cell disclosed in this application can directly correct an error bit through reprogramming, can simplify circuit and layout design, requires a smaller layout area, and has higher reliability and safety.

8 Claims, 4 Drawing Sheets

ONE TIME PROGRAMMABLE MEMORY CELL

CROSS-REFERENCE TO RELATED APPLICATIONS

This application claims the priority to Chinese Patent Application No. 202311085047.8, filed on Aug. 25, 2023, the disclosure of which is incorporated herein by reference in its entirety.

TECHNICAL FIELD

This application relates to an integrated circuit design technology, in particular to a One Time Programmable (OTP) memory cell that can perform one correction operation on a programming result.

BACKGROUND

There are two common types of One Time Programmable (OTP) memory cells, namely anti-fuse OTP memory cell (anti-fuse) and fuse OTP memory cell (eFuse). Both of these OTP memory cells adopt a standard CMOS technology and have a small cell area, thus reducing the total cost and achieving good safety.

The anti-fuse OTP memory cell (anti-fuse), by breaking down an insulating layer between a polycrystalline layer and an N+ diffusion layer of a programmable transistor, causes the resistance between the two layers to change (decrease), resulting in a change in the equivalent logic value and achieving programming from "1" to "0". The anti-fuse OTP memory cell (anti-fuse) can only program once, i.e., "1"→"0", which limits its application range and flexibility.

The fuse OTP memory cell (eFuse) is programmed based on the characteristics of electron migration by burning out the fuse to cause the resistance between the two ends of the fuse to change. Similarly, it can only be programmed once, which greatly limits the user's on-site use conditions and product production testing capabilities, resulting in poor redundancy.

A conventional fuse OTP memory cell (eFuse) is as illustrated in FIG. 1. If one programming result of the conventional fuse OTP memory cell (eFuse) needs to be corrected, it is usually achieved by adopting a dual-bit backup or redundant correction bit. The former achieves reliable programming operations by recording the same data with two fuse OTP memory cells, and by backing up each other with the two fuse OTP memory cells. The latter involves adding a redundant bit outside normal bits. After programming the redundant bit, the address information and the actual value at the error bit are recorded at the redundant bit. If the input bit address happens to be the address where the error occurs, the system will ignore the stored error value and read out the correct value at the corresponding redundant bit. The use of dual-bit backup or redundant correction bit for programming result correction has the disadvantages of complex circuit and layout design, layout area increase, and low reliability.

BRIEF SUMMARY

The technical problem to be solved by this application is to provide a One Time Programmable (OTP) memory cell, which can directly correct an error bit through reprogramming, can simplify circuit and layout design, requires a smaller layout area, has higher reliability and safety, and increases the applicability and flexibility.

In order to solve the technical problem, the OTP memory cell provided in this application includes one anti-fuse programmable transistor M0, one fuse F, and two control transistors;

a gate end of the anti-fuse programmable transistor M0 being used as a Q end of the OTP memory cell, the Q end being configured to be connected to a bit line BL;
 one of a source end and a drain end of a first control transistor M1 being connected to one of a source end and a drain end of the anti-fuse programmable transistor M0, the other of the source end and the drain end of the first control transistor M1 being connected to one of a source end and a drain end of a second control transistor M2 and one end of the fuse F, a gate end of the first control transistor M1 being used as a WL end of the OTP memory cell, the WL end being configured to be connected to a main word line;
 the other of the source end and the drain end of the second control transistor M2 being connected to the ground GND, a gate end of the second control transistor M2 being used as a WL_P end of the OTP memory cell, the WL_P end being configured to be connected to an auxiliary word line;
 the other end of the fuse F being used as an FS end of the OTP memory cell, the FS end being configured to be connected to a state select line.

Exemplarily, the other of the source end and the drain end of the anti-fuse programmable transistor M0 is floating.

Exemplarily, the anti-fuse programmable transistor M0, the first control transistor M1, and the second control transistor M2 are all NMOS transistors;

the drain end of the first control transistor M1 is connected to the source end of the anti-fuse programmable transistor M0, and the source end of the first control transistor M1 is connected to the drain end of the second control transistor M2;
 the source end of the second control transistor M2 is connected to the ground GND.

Exemplarily, before programming, the OTP memory cell is in an initial state;

when the OTP memory cell is in the initial state, the WL end, the WL_P end, the Q end, and the FS end are all connected to 0V, the gate end and the source end of the anti-fuse programmable transistor M0 therebetween present a high resistance state, the fuse F presents a low resistance state, the first NMOS control transistor M1 is turned on, the Q end and the FS end therebetween present a high resistance state before programming, and the logic state of the OTP memory cell is defined as "1".

Exemplarily, when a normal programming operation is performed on the OTP memory cell, working voltage VDD is applied to both the WL end and the WL_P end, the FS end is floating, and gate oxide breakdown voltage VPPH is applied to the Q end; the first control transistor M1 and the second control transistor M2 are turned on; the gate oxide breakdown voltage VPPH is higher than breakdown voltage between the gate end and the source end of the anti-fuse programmable transistor M0, resulting in the breakdown of an oxide layer between the gate end and the source end of the anti-fuse programmable transistor M0 and a decrease in the resistance between the gate end and the source end of the anti-fuse programmable transistor M0; the fuse F maintains a low resistance state due to no current passing through; after the normal programming operation, the OTP memory cell presents a low resistance state between the Q end and the FS end, and the OTP memory cell is programmed to a logic state "0".

Exemplarily, when the normal programming operation is performed on the OTP memory cell, the resistance between the gate end and the source end before the breakdown of the oxide layer between the gate end and the source end of the anti-fuse programming transistor M0 is greater than 10 M $\Omega$, and the resistance between the gate end and the source end after the breakdown is 20 K $\Omega$ to 30 K $\Omega$.

Exemplarily, when a correction programming operation is performed on the OTP memory cell after the normal programming operation, the Q end is floating, the WL end is connected to 0V, and fuse burn-out voltage VDDQ is applied to the FS end and the WL_P end to control the second control transistor M2 to be turned on and the first control transistor M1 to be turned off; programming current flows through the FS end, the fuse F, and the second control transistor M2 to the ground, causing the fuse F to burn out; after the correction programming operation, the OTP memory cell presents a high resistance state between the Q end and the FS end, and is reprogrammed to a logic state "1".

Exemplarily, during a reading operation, the WL_P end of the OTP memory cell is connected to 0V, the WL end is connected to working voltage VDD, the FS is connected to the ground, and the Q end is connected to a sense amplifier;

the sense amplifier converts the equivalent resistance between the Q end and the FS end into a logic value for output when the reading operation is performed on the OTP memory cell.

The OTP memory cell disclosed in this application is obtained by adding one anti-fuse programmable transistor to a conventional fuse programmable memory cell (eFuse) (2T1R structure, composed of two control transistors and one fuse), is programmed by breaking down the gate-source isolation layer of the anti-fuse programmable transistor (large resistance becomes small resistance), and is reprogrammed by burning out the fuse F (resistance becomes larger). Compared with the traditional anti-fuse OTP memory cell, it adds one reprogramming capability, which means that after a normal programming operation is performed on the OTP memory cell, one more correction operation can be performed on the programming result. The OTP memory cell disclosed in this application has one correction capability to modify the data output after the programming operation once again, thus changing the logic state after the first programming operation, expanding the flexibility of use, and improving the applicability of the OTP memory cell. In addition, the OTP memory cell can directly correct an error bit through reprogramming, can simplify circuit and layout design relative to the existing method of adding one correction capability in a redundant manner, requires a smaller layout area, and has higher reliability and safety.

BRIEF DESCRIPTION OF THE DRAWINGS

In order to clarify the technical solution of this application more clearly, the drawings to be used in this application will be briefly introduced below. Apparently, the drawings in the following description are only some embodiments of this application. Those skilled in the art may obtain other drawings according to these drawings without contributing any inventive labor.

DETAILED DESCRIPTION OF THE APPLICATION

The technical solution of this application will be described below more clearly and completely with reference to the drawings. Apparently, the described embodiments are a part of the embodiments of this application, instead of all of them. Based on the embodiments of this application, all other embodiments obtained by those skilled in the art without contributing any inventive labor still fall within the scope of protection of this application.

Embodiment 1

Figure 1:
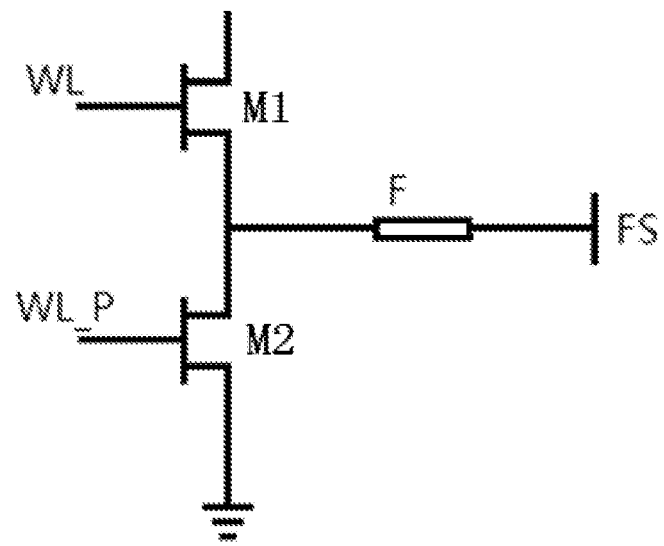
FIG. 1 illustrates a circuit diagram of a conventional fuse One Time Programmable (OTP) memory cell.
Figure 2:
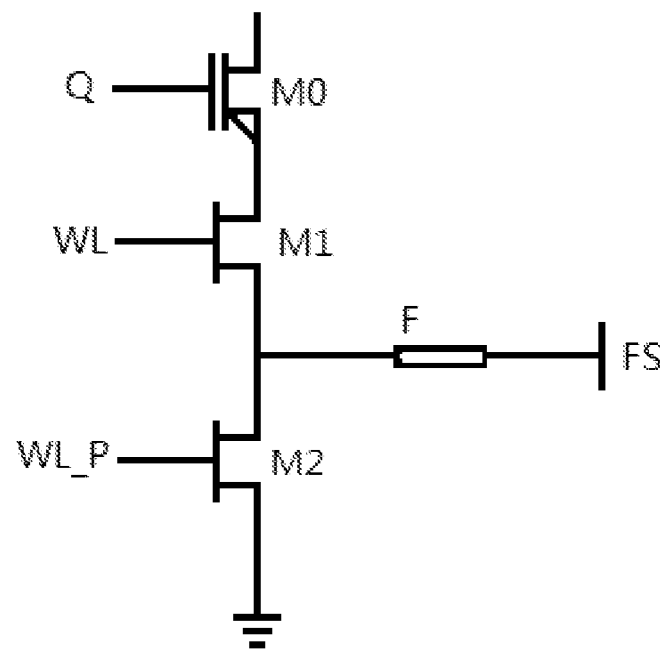
FIG. 2 illustrates a circuit diagram of an OTP memory cell according to an embodiment of this application.

Referring to FIG. 2, a One Time Programmable (OTP) memory cell includes one anti-fuse programmable transistor M0, one fuse F, and two control transistors.

A gate end of the anti-fuse programmable transistor M0 is used as a Q end of the OTP memory cell, and the Q end is configured to be connected to a bit line BL.

One of a source end and a drain end of a first control transistor M1 is connected to one of a source end and a drain end of the anti-fuse programmable transistor M0, the other of the source end and the drain end of the first control transistor M1 is connected to one of a source end and a drain end of a second control transistor M2 and one end of the fuse F, a gate end of the first control transistor M1 is used as a WL end of the OTP memory cell, and the WL end is configured to be connected to a main word line.

The other of the source end and the drain end of the second control transistor M2 is connected to the ground GND, a gate end of the second control transistor M2 is used as a WL_P end of the OTP memory cell, and the WL_P end is configured to be connected to an auxiliary word line.

The other end of the fuse F is used as an FS end of the OTP memory cell, and the FS end is configured to be connected to a state select line.

Exemplarily, the other of the source end and the drain end of the anti-fuse programmable transistor M0 is floating.

The OTP memory cell in embodiment 1 is obtained by adding one anti-fuse programmable transistor to a conventional fuse programmable memory cell (eFuse) (2T1R structure, composed of two control transistors and one fuse), is programmed by breaking down the gate-source isolation layer of the anti-fuse programmable transistor (large resistance becomes small resistance), and is reprogrammed by burning out the fuse F (resistance becomes larger). Compared with the traditional anti-fuse OTP memory cell, it adds one reprogramming capability, which means that after a normal programming operation is performed on the OTP memory cell, one more correction operation can be performed on the programming result.

The OTP memory cell in embodiment 1 has one correction capability to modify the data output after the programming operation once again, thus changing the logic state after the first programming operation, expanding the flexibility of use, and improving the applicability of the OTP memory cell. In addition, the OTP memory cell can directly correct an error bit through reprogramming, can simplify circuit and layout design relative to the existing method of adding one correction capability in a redundant manner, requires a smaller layout area, and has higher reliability and safety.

Embodiment 2

Based on the OTP memory cell in embodiment 1, the anti-fuse programmable transistor M0, the first control transistor M1, and the second control transistor M2 are all NMOS transistors.

The drain end of the first control transistor M1 is connected to the source end of the anti-fuse programmable transistor M0, and the source end of the first control transistor M1 is connected to the drain end of the second control transistor M2.

The source end of the second control transistor M2 is connected to the ground GND.

Exemplarily, the drain end of the anti-fuse programmable transistor M0 is floating.

Embodiment 3

Based on the OTP memory cell in embodiment 1 or 2, before programming, the OTP memory cell is in an initial state.

Figure 3:
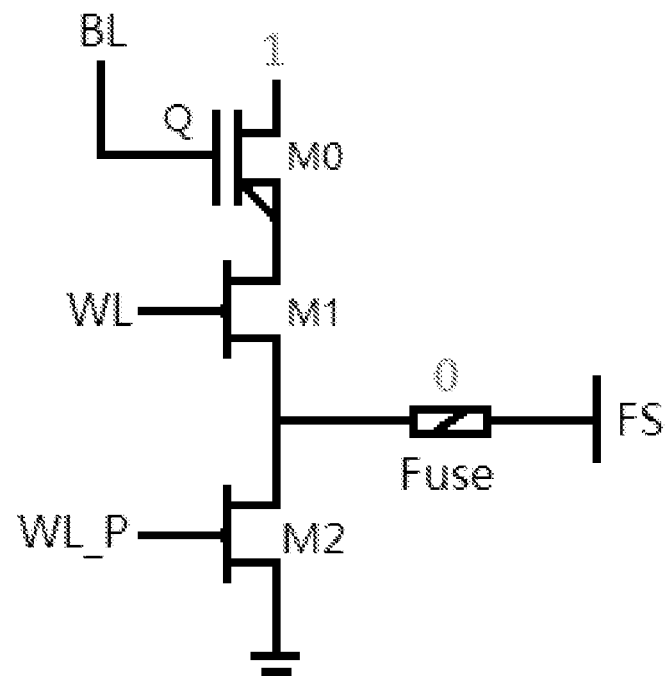
FIG. 3 illustrates a schematic diagram of an OTP memory cell in an initial state according to an embodiment of this application.

When the OTP memory cell is in the initial state, the WL end, the WL_P end, the Q end, and the FS end are all connected to 0V, the gate end and the source end of the anti-fuse programmable transistor M0 therebetween present a high resistance state, the fuse F presents a low resistance state, the first NMOS control transistor M1 is turned on, the Q end and the FS end therebetween present a high resistance state before programming, and the logic state of the OTP memory cell is defined as "1", as illustrated in FIG. 3.

Figure 4:
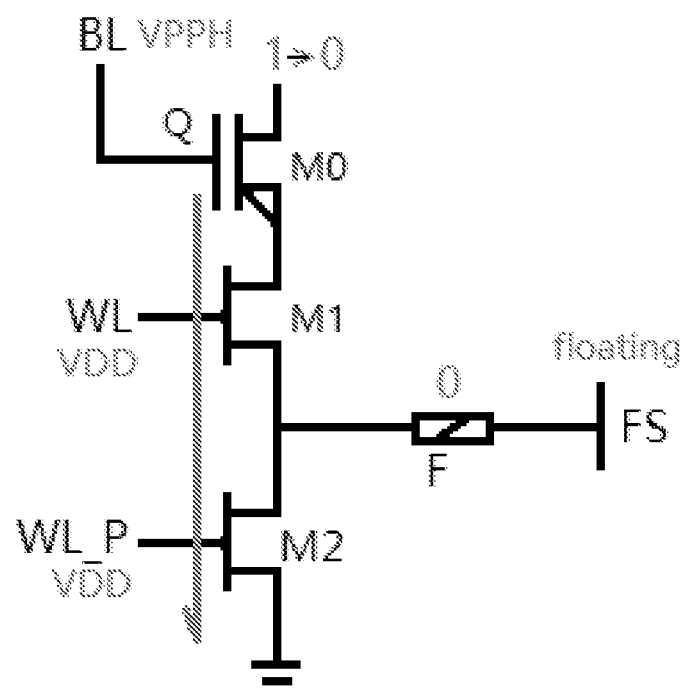
FIG. 4 illustrates a schematic diagram of an OTP memory cell in a normal programming state according to an embodiment of this application.

Exemplarily, when a normal programming (first programming) operation is performed on the OTP memory cell, working voltage VDD is applied to both the WL end and the WL_P end, the FS end is floating, and gate oxide breakdown voltage VPPH is applied to the Q end; the first control transistor M1 and the second control transistor M2 are turned on; the gate oxide breakdown voltage VPPH is higher than breakdown voltage between the gate end and the source end of the anti-fuse programmable transistor M0, resulting in the breakdown of an oxide layer between the gate end and the source end of the anti-fuse programmable transistor M0 and a decrease in the resistance between the gate end and the source end of the anti-fuse programmable transistor M0 (the resistance between the gate end and the source end before the breakdown of the oxide layer between the gate end and the source end of the anti-fuse programming transistor M0 is greater than 10 MΩ, and the resistance between the gate end and the source end after the breakdown is about 20 KΩ to 30 KΩ); the fuse F maintains a low resistance state due to no current passing through; after the normal programming operation, the OTP memory cell presents a low resistance state between the Q end and the FS end, and the OTP memory cell is programmed to a logic state "0", as illustrated in FIG. 4.

Figure 5:
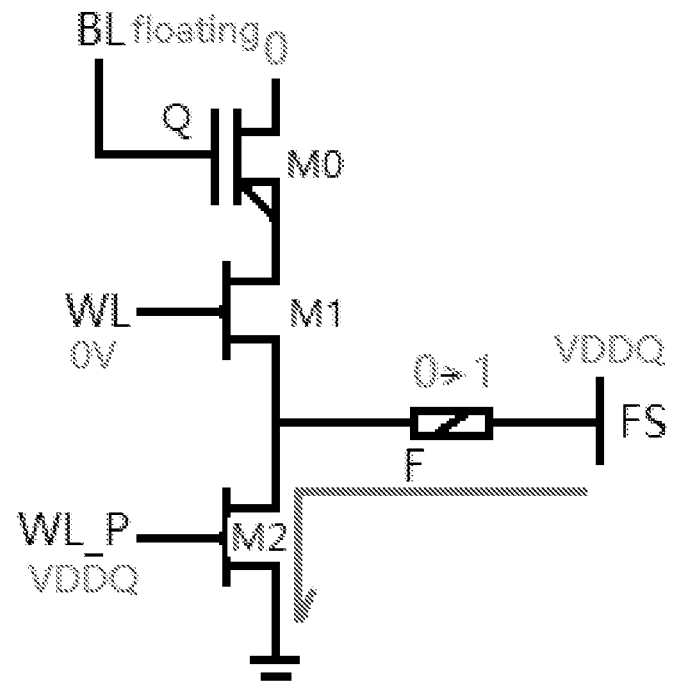
FIG. 5 illustrates a schematic diagram of an OTP memory cell in a correction programming state according to an embodiment of this application.

Exemplarily, if the OTP memory cell needs to be corrected after the normal programming operation, that is, in a case that the logic state after the first programming needs to be corrected from "0" to "1", a programming operation may be performed again. When a correction programming (second programming) operation is performed, the Q end is floating, the WL end is connected to 0V, and fuse burn-out voltage VDDQ is applied to the FS end and the WL_P end to control the second control transistor M2 to be turned on and the first control transistor M1 to be turned off; programming current flows through the FS end, the fuse F, and the second control transistor M2 to the ground, causing the fuse F to burn out due to electromigration; after the correction programming operation, the OTP memory cell presents a high resistance state between the Q end and the FS end, and is reprogrammed to a logic state "1", as illustrated in FIG. 5.

Exemplarily, during a reading operation, the WL_P end of the OTP memory cell is connected to 0V, the WL end is connected to working voltage VDD, the FS is connected to the ground, and the Q end is connected to a sense amplifier (SA).

Figure 6:
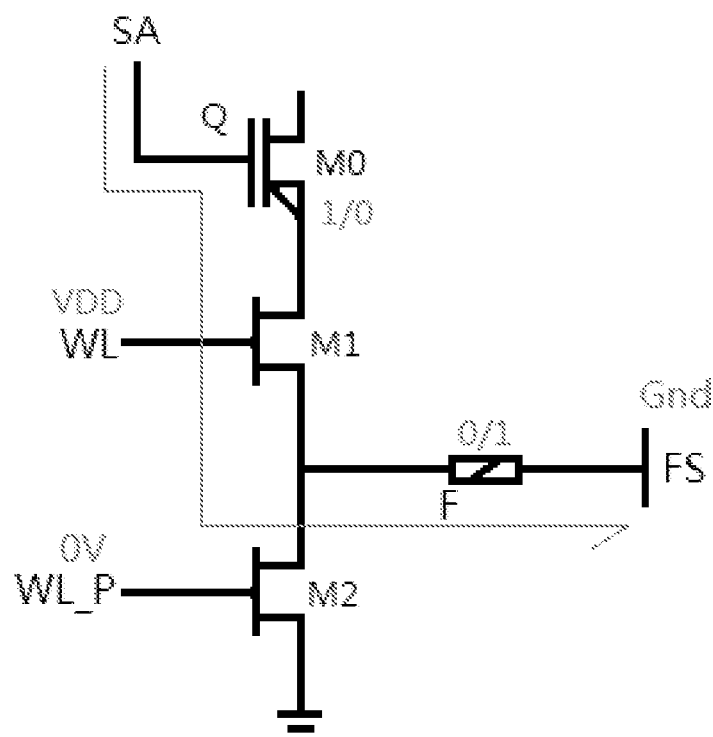
FIG. 6 illustrates a schematic diagram of an OTP memory cell in a reading state according to an embodiment of this application.

The sense amplifier (SA) converts the equivalent resistance between the Q end and the FS end into a logic value for output when the reading operation is performed on the OTP memory cell, as illustrated in FIG. 6.

The port state and the resistance changes of the OTP memory cell in embodiment 3 under a working mode are as shown in the table below:

| Cell port and resistance | Initial state | First programming | Second programming | Reading |
|---|---|---|---|---|
| Q | 0V | VPPH | Floating | VDD |
| WL | 0V | VDD | 0V | VDD |
| WL_P | 0V | VDD | VDDQ | 0V |
| FS | 0V | Floating | VDDQ | 0V |
| Q-FS | High resistance | Low resistance | High resistance | High/low resistance |

Figure 7:
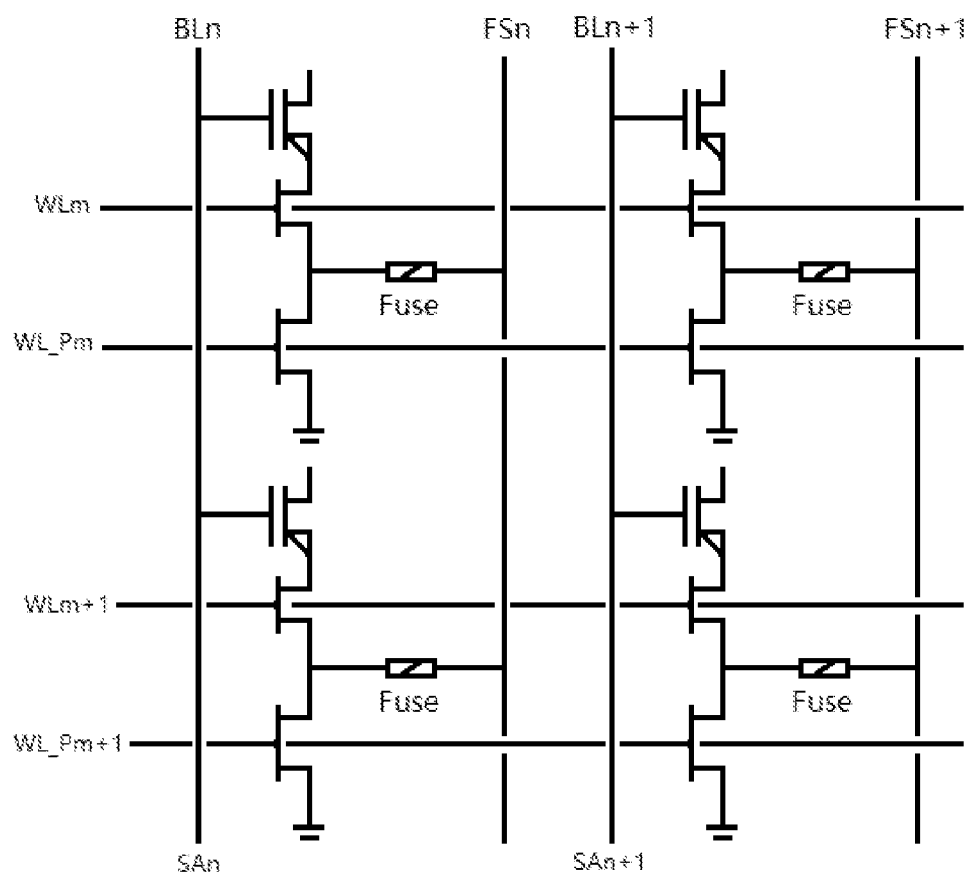
FIG. 7 illustrates a schematic diagram of a memory array formed by OTP memory cells according to an embodiment of this application.

A cell array formed by the OTP memory cells disclosed in this application is as illustrated in FIG. 7. In the array, the Q ends of the cells in the same column are connected to the same bit line BLn and to the corresponding sense amplifier SAn, the FS ends of the cells in the same column are connected to the same state select line FSn, the WL ends of the cells in the same row are connected to the same main word line WLm, and the WL_P ends of the cells in the same row are connected to the same auxiliary word line WL_Pm.

What are described above are just exemplary embodiment of this application, which are not intended to limit this application. Any modifications, equivalent replacements, improvements and the like made within the spirit and principle of this application are included within the scope of protection of this application.

What is claimed is:

1. A one time programmable memory cell, comprising an anti-fuse programmable transistor, a fuse, and two control transistors;
   a gate end of the anti-fuse programmable transistor being used as a Q end of the one time programmable memory cell, the Q end being configured to be connected to a bit line;

one of a source end and a drain end of a first control transistor being connected to one of a source end and a drain end of the anti-fuse programmable transistor, the other of the source end and the drain end of the first control transistor being connected to one of a source end and a drain end of a second control transistor and one end of the fuse, a gate end of the first control transistor being used as a WL end of the one time programmable memory cell, the WL end being configured to be connected to a main word line;

the other of the source end and the drain end of the second control transistor being connected to a ground, a gate end of the second control transistor being used as a WL_P end of the one time programmable memory cell, the WL_P end being configured to be connected to an auxiliary word line; and the other end of the fuse being used as an FS end of the one time programmable memory cell, the FS end being configured to be connected to a state select line.

2. The one time programmable memory cell according to claim 1, wherein the other of the source end and the drain end of the anti-fuse programmable transistor is floating.

3. The one time programmable memory cell according to claim 1, wherein the anti-fuse programmable transistor, the first control transistor, and the second control transistor are all NMOS transistors;

the drain end of the first control transistor is connected to the source end of the anti-fuse programmable transistor, and the source end of the first control transistor is connected to the drain end of the second control transistor; and the source end of the second control transistor is connected to the ground.

4. The one time programmable memory cell according to claim 3, wherein before programming, the one time programmable memory cell is in an initial state; and when the one time programmable memory cell is in the initial state, the WL end, the WL_P end, the Q end, and the FS end are all connected to 0V, the gate end and the source end of the anti-fuse programmable transistor therebetween present a high resistance state, the fuse presents a low resistance state, the first control transistor is turned on, the Q end and the FS end therebetween present a high resistance state before programming, and a logic state of the one time programmable memory cell is defined as "1".

5. The one time programmable memory cell according to claim 4, wherein, when a normal programming operation is performed on the one time programmable memory cell, a working voltage is applied to both the WL end and the WL_P end, the FS end is floating, and a gate oxide breakdown voltage is applied to the Q end; the first control transistor and the second control transistor are turned on; the gate oxide breakdown voltage is higher than a breakdown voltage between the gate end and the source end of the anti-fuse programmable transistor, resulting in a breakdown of an oxide layer between the gate end and the source end of the anti-fuse programmable transistor and a decrease in a resistance between the gate end and the source end of the anti-fuse programmable transistor; the fuse maintains a low resistance state due to no current passing through; and, after the normal programming operation, the one time programmable memory cell presents a low resistance state between the Q end and the FS end, and the one time programmable memory cell is programmed to a logic state "0".

6. The one time programmable memory cell according to claim 5, wherein, when the normal programming operation is performed on the one time programmable memory cell, a resistance between the gate end and the source end before the breakdown of the oxide layer between the gate end and the source end of the anti-fuse programming transistor is greater than 10 M $\Omega$, and a resistance between the gate end and the source end after the breakdown is 20K $\Omega$ to 30K $\Omega$.

7. The one time programmable memory cell according to claim 5, wherein, when a correction programming operation is performed on the one time programmable memory cell after the normal programming operation, the Q end is floating, the WL end is connected to 0V, and a fuse burn-out voltage is applied to the FS end and the WL_P end to control the second control transistor to be turned on and the first control transistor to be turned off; programming current flows through the FS end, the fuse, and the second control transistor to the ground, causing the fuse to burn out; and, after the correction programming operation, the one time programmable memory cell presents a high resistance state between the Q end and the FS end, and is reprogrammed to a logic state "1".

8. The one time programmable memory cell according to claim 3, wherein during a reading operation, the WL_P end of the one time programmable memory cell is connected to 0V, the WL end is connected to a working voltage, the FS end is connected to the ground, and the Q end is connected to a sense amplifier; and the sense amplifier converts an equivalent resistance between the Q end and the FS end into a logic value for output when the reading operation is performed on the one time programmable memory cell.

\* \* \* \* \*